United States Patent
Lai

(10) Patent No.: US 11,538,829 B2
(45) Date of Patent: Dec. 27, 2022

(54) MEMORY DEVICE WITH FIRST SWITCH AND WORD LINE SWITCHES COMPRISING A COMMON CONTROL ELECTRODE AND MANUFACTURING METHOD FOR THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 282 days.

(21) Appl. No.: 17/004,048

(22) Filed: Aug. 27, 2020

(65) Prior Publication Data
US 2021/0249435 A1    Aug. 12, 2021

Related U.S. Application Data

(60) Provisional application No. 62/972,051, filed on Feb. 9, 2020.

(51) Int. Cl.
| | |
|---|---|
| G11C 8/14 | (2006.01) |
| H01L 27/1157 | (2017.01) |
| H01L 27/11582 | (2017.01) |
| G11C 7/18 | (2006.01) |
| G11C 16/04 | (2006.01) |

(52) U.S. Cl.
CPC ......... *H01L 27/11582* (2013.01); *G11C 7/18* (2013.01); *G11C 8/14* (2013.01); *G11C 16/0483* (2013.01); *H01L 27/1157* (2013.01)

(58) Field of Classification Search
CPC .......... H01L 27/11582; H01L 27/1157; H01L 27/11575; H01L 27/11573; G11C 7/18; G11C 8/14; G11C 16/0483
See application file for complete search history.

(56) References Cited

U.S. PATENT DOCUMENTS

| | | | |
|---|---|---|---|
| 10,636,812 B1 | 4/2020 | Lai et al. | |
| 2014/0269100 A1* | 9/2014 | Sel | G11C 7/12 365/185.24 |
| 2016/0163389 A1 | 6/2016 | Zhang et al. | |
| 2018/0342298 A1 | 11/2018 | Goda et al. | |
| 2019/0312050 A1 | 10/2019 | Lai et al. | |
| 2019/0371404 A1* | 12/2019 | Minamoto | H01L 27/11524 |
| 2020/0051638 A1* | 2/2020 | Goda | H01L 27/115 |

* cited by examiner

*Primary Examiner* — Jerome Leboeuf

(74) *Attorney, Agent, or Firm* — McClure, Qualey & Rodack, LLP

(57) ABSTRACT

A memory device and a manufacturing for the same are provided. The memory device comprises a channel line, word lines, a first switch, and a second switch. Memory cells for a memory string are defined at intersections between the channel line and the word lines. The first switch is electrically connected with the channel line. The second switch is electrically connected with the channel line. The first switch is electrically connected between the second switch and the memory cells.

18 Claims, 16 Drawing Sheets

MEMORY DEVICE WITH FIRST SWITCH AND WORD LINE SWITCHES COMPRISING A COMMON CONTROL ELECTRODE AND MANUFACTURING METHOD FOR THE SAME

This application claims the benefit of U.S. provisional application Ser. No. 62/972,051, filed Feb. 9, 2020, the subject matter f which is incorporated herein by reference.

BACKGROUND

Technical Field

The disclosure relates to a memory device and a manufacturing method for the same.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present disclosure relates to a memory device and a manufacturing method for the same.

According to an embodiment, a memory device is provided. The memory device comprises a channel line, word lines, a first switch, and a second switch. Memory cells for a memory string are defined at intersections between the channel line and the word lines. The first switch is electrically connected with the channel line. The second switch is electrically connected with the channel line. The first switch is electrically connected between the second switch and the memory cells.

According to another embodiment, a manufacturing method for a memory device is provided. The manufacturing method comprises the following steps. A stacked structure is formed. The stacked structure comprises a memory array stack and a staircase stack. A pillar structure is formed. The pillar structure passes through the memory array stack. A first electrode layer is formed. The first electrode layer is on the stacked structure. An insulating layer is formed on the first electrode layer. A second electrode layer is formed on the insulating layer. A pillar element is formed on the staircase stack and passing through the first electrode layer. A pillar component is formed on the pillar structure and passing through the first electrode layer and the second electrode layer.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
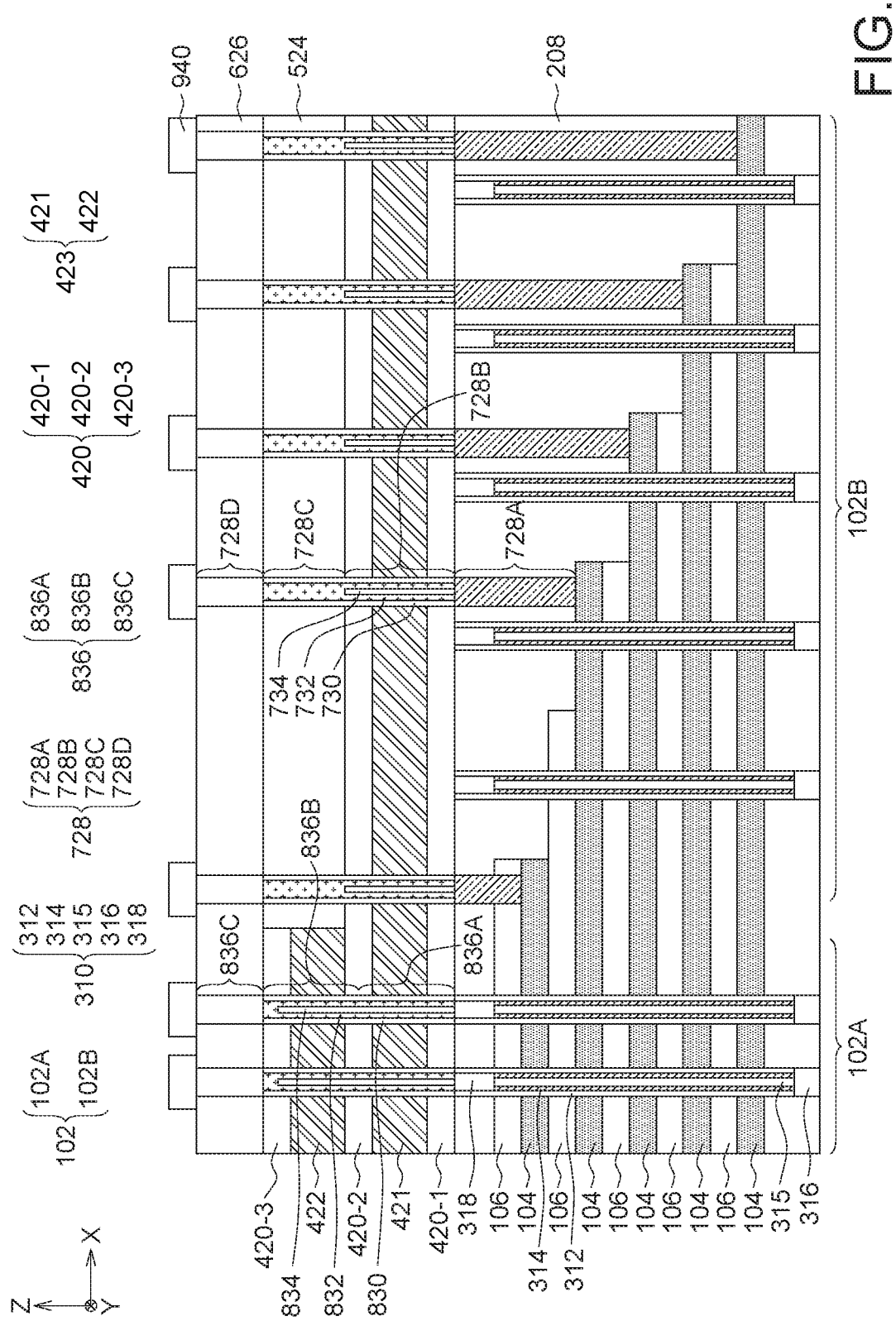
FIG. 1 illustrates a cross-section view of a memory device in an embodiment.

FIG. 1 is referred to, which illustrates a cross-section view of a memory device in an embodiment. The memory device may be a 3D vertical channel NAND memory array.

A stacked structure 102 comprises electrode films 104 and insulating films 106 stacked alternately in a vertical direction Z. The stacked structure 102 comprises a memory array stack 102A and a staircase stack 102B. An insulating material film 208 is on the stacked structure 102. FIG. 1 shows 5 levels of the electrode films 104. However, the present disclosure is not limited thereto. There may be more levels of the electrode films 104, such as 38 levels of the electrode films 104, etc.

A pillar structure 310 may pass through the stacked structure 102 and the insulating material film 208. The pillar structure 310 may comprise memory material film 312, a channel film 314, and an insulating pillar 315. The memory material film 312 may have a tube shape, and may be between the channel film 314 and the stacked structure 102. The channel film 314 may have a tube shape, and between the insulating pillar 315 and the memory material film 312. The pillar structure 310 may comprise an epitaxial element 316 and an epitaxial element 318 respectively on opposing sides of the channel film 314 in the vertical direction Z. The pillar structure 310 may be in the memory array stack 102A, and memory cells M may be defined at intersections between the channel film 314 of the pillar structure 310 and the electrode films 104 (such as the electrode films 104 of intermediate levels such as the second level to the fifth level). The pillar structure 310 may be in the staircase stack 102B, and the pillar structure 310 may be electrical floating, and therefore regarded as a dummy pillar structure.

Insulating layers 420 and electrode layers 423 may be disposed on the insulating material film 208. The insulating layers 420 may comprise an insulating layer 420-1, an insulating layer 420-2 and an insulating layer 420-3. The electrode layers 423 comprise a first electrode layer 421 and a second electrode layer 422. The insulating layer 420-1 may be on the insulating material film 208. The first electrode layer 421 may be on the insulating layer 420-1. The insulating layer 420-2 may be on the first electrode layer 421. The second electrode layer 422 may be on the insulating layer 420-2. The insulating layer 420-3 may be on the second electrode layer 422. The first electrode layer 421 is between the second electrode layer 422 and the electrode films 104. An insulating element 524 may be on an upper surface of the first electrode layer 421, a sidewall surface of the second electrode layer 422, and a sidewall surface of the insulating layer 420-3. A dielectric layer 626 may be on the insulating element 524.

A pillar element 728 is on the staircase stack 102B of the stacked structure 102, and electrically connected on the electrode films 104. The pillar element 728 may comprise a first pillar portion 728A, a second pillar portion 728B, a third pillar portion 728C and a fourth pillar portion 728D arranged from a lower side to an upper side in order. The first pillar portion 728A may pass through the insulating material film 208 to extend vertically to load on the electrode film 104, The second pillar portion 728B passes through the first electrode layer 421 and the insulating layer 420-1 under the first electrode layer 421. The second pillar portion 728B may be extended to a lower portion of the insulating element 524. The second pillar portion 728B is between the first pillar portion 728A and the third pillar portion 728C, The second pillar portion 728B may comprise a dielectric element 730, a channel element 732 and a dielectric pillar 734, The dielectric element 730 is between the channel element 732 and the first electrode layer 421, The channel element 732 is between the dielectric pillar 734 and the dielectric element 730. The channel element 732 and the dielectric element 730 of the second pillar portion 728B may have a tube shape. The pillar element 728 may be electrically insulated from the first electrode layer 421 by the dielectric element 730. The third pillar portion 728C may be in the insulating element 524 on the sidewall surface of the second electrode layer 422. The third pillar portion 7280 may comprise the dielectric element 730 and the channel element 732. The dielectric element 730 may be between the (channel element 732 and the insulating element 524. The first pillar portion 728A, the channel element 732 of the second pillar portion 728B, the channel element 732 of the third pillar portion 7280 and the fourth pillar portion 728D may be electrically connected to each other. In an embodiment, the first pillar portion 728A and the fourth pillar portion 728D comprise a barrier film and a metal film. The barrier film may comprise TiN. The metal film ay comprise W. The channel element 732 of the second pillar portion 728B comprises un-doped polysilicon. The channel element 732 of the third pillar portion 728C comprises doped polysilicon, such as N type heavily doped polysilicon. Therefore, electrical conductivities of the first pillar portion 728A and the fourth pillar portion 728D are higher than an electrical conductivity of the channel element 732 of the third pillar portion 728C. In addition, the electrical conductivity of the channel element 732 of the third pillar portion 728C is higher than an electrical conductivity of the channel element 732 of the second pillar portion 728B. However, the present disclosure is not limited thereto.

A pillar component 836 is on the memory array stack 102A of the stacked structure 102. The pillar component 836 may comprise a first pillar portion 836A, a second pillar portion 836B and a third pillar portion 836C arranged from a lower side to an upper side in order.

The first pillar portion 836A may pass through the first electrode layer 421 and the insulating layer 420-1 under the first electrode layer 421, and extend into a lower portion of the insulating layer 420-2 between the first electrode layer 421 and the second electrode layer 422. The second pillar portion 836B may pass through the second electrode layer 422 and the insulating layer 420-3 over the second electrode layer 422, and extend into an upper portion of the insulating layer 420-2 between the first electrode layer 421 and the second electrode layer 422. The first pillar portion 836A and the second pillar portion 836B may comprise a dielectric element 830, a channel element 832 and a dielectric pillar 834. The channel element 832 may be between the dielectric element 830 and the dielectric pillar 834. The dielectric element 830 may have a tube shape. The pillar component may be electrically insulated from the first electrode layer 421 and the second electrode layer 422 by the dielectric element 830.

In an embodiment, the channel element 832 of the first pillar portion 836A and the second pillar portion 836B may comprise un-doped polysilicon, and have a tube shape. A top portion of the channel element 832 of the second pillar portion 836B may comprise doped polysilicon, such as N type heavily doped polysilicon. The third pillar portion 8360 may comprise a barrier film and a metal film on the barrier film. The barrier film may comprise TiN. The metal film may comprise W. However, the present disclosure is not limited thereto. The epitaxial element 318 is electrically connected between the channel element 832 and the channel film 314.

A metal routing layer 940 may be on the dielectric layer 626.

Figure 2:
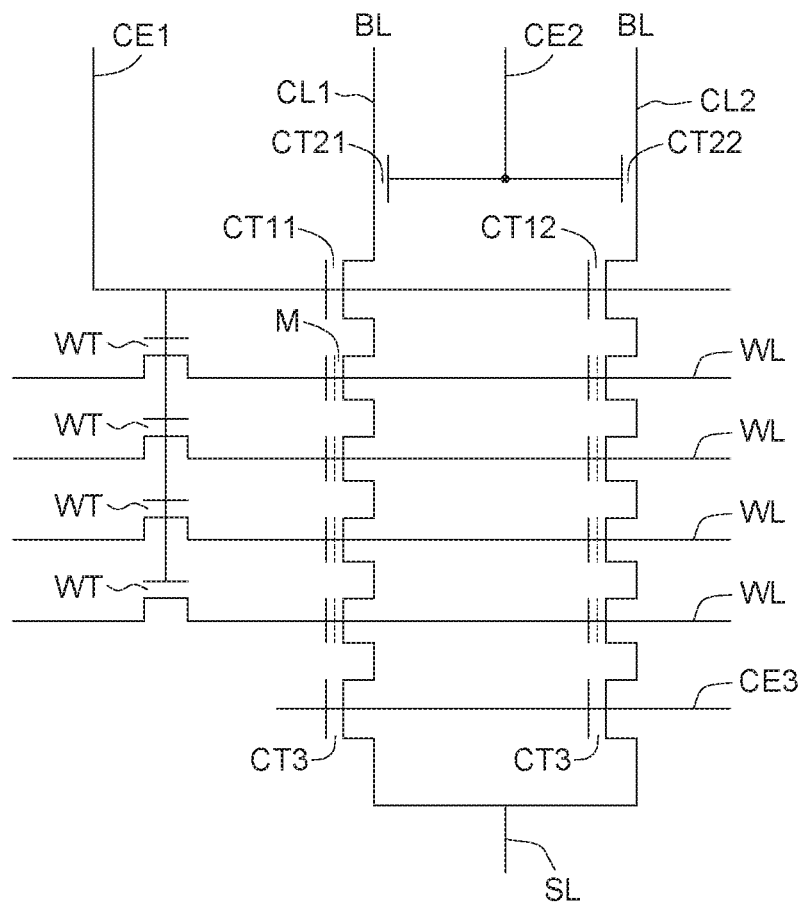
FIG. 2 illustrates a circuit diagram of the memory device in FIG. 1.

FIG. 2 is referred to, which illustrates a circuit diagram of the memory device in FIG. 1.

The memory cells M of the NAND memory string are defined at intersections between a channel line CL (comprising a channel line CL1 and a channel line CL2) and word lines WL. The channel line CL may comprise the channel film 314, the epitaxial element 316 and the epitaxial element 318 of the pillar structure 310, and the channel element 832 of the first pillar portion 836A and the second pillar portion 836B, and the third pillar portion 836C of the pillar component 836, as shown in FIG. 1, for example. The word line WL may comprise the electrode films 104 of the second level to the fourth level, as shown in FIG. 1, for example. The word line WL may further comprise the first pillar portion 728A, the channel element 732 of the second pillar portion 728B and the third pillar portion 7280, and the fourth pillar portion 728D of the pillar element 728 as shown in FIG. 1.

A first switch CT1, a second switch CT2 and a third switch CT3 are electrically connected with the channel line CL. The first switch CT1 is electrically connected between the second switch CT2 and the memory cells M. The second switch CT2 is electrically connected between a bit line BL and the first switch CT1. The third switch CT3 is electrically connected between a source line SL and the memory cells M. The first switch CT1 may be referred to as a first channel switch. The second switch CT2 may be referred to as a second channel switch. The first switch CT1 and the second switch CT2 may be functioned as string selection switches. The third switch CT3 may be functioned as a ground selection switch.

The first switch CT1 may be a transistor switch, comprising the first electrode layer 421 and the channel element 832 and the dielectric element 830 of the first pillar portion 836A of the pillar component 836 as shown in FIG. 1. The first electrode layer 421 and the dielectric element 830 are respectively functioned as a control gate electrode (or a control electrode CE1) and a gate dielectric of a transistor.

The second switch CT2 may be a transistor switch, comprising the second electrode layer 422 and the channel element 832 and the dielectric element 830 of the second pillar portion 836B of the pillar component 836 as shown in FIG. 1. The second electrode layer 422 and the dielectric element 830 are respectively functioned as a control gate electrode (or a control electrode CE2) and a gate dielectric of a transistor.

A word line switches WT are electrically connected with the word line WL. The word line switches WT may be electrically connected between a word line decoder (not shown) and the memory cells M. The word line switch WT may be a transistor switch, comprising the first electrode layer 421 and the channel element 732 and the dielectric element 730 of the second pillar portion 728B as shown in FIG. 1. The first electrode layer 421 and the dielectric element 730 are respectively functioned as a control gate electrode (or the control electrode CE1) and a gate dielectric of a transistor.

In an embodiment, the dielectric element 730 and the dielectric element 830 functioned as the gate dielectric are a single-layer oxide layer, such as a silicon oxide layer. Compared to memory material film of multi-layer structure, the dielectric element 730 and the dielectric element 830 in this embodiment may have a thinner thickness. Therefore, the transistors can have a reduced operating voltage, and can have a faster operating speed. In addition, operating effect similar with the memory cell M, such as a programming effect, as erasing effect and so on can be avoided to the transistor.

The first switch CT1 may comprise a first switch CT11 and a first switch CT12 corresponding to NAND memory strings. The first switch CT11, the first switch CT12 and the word line switch WT comprise the common control electrode CE1, and therefore can be turned off or turned on at the same time by applying a common voltage to the control electrode CE1 in an operating procedure of the memory device. There is no need of an additional decoder for the word line switches WT. The control electrode CE1 may comprise the first electrode layer 421 as shown in FIG. 1, which may be functioned as a string select line for the NAND memory string, and may be functioned as a word line select line for the word line WL. The second switch CT2 may comprise a second switch CT21 and a second switch CT22 corresponding to the NAND memory strings. The second switch CT21 and the second switch CT22 may comprise the common control electrode CE2, and therefore can be turned off or turned on at the same time in an operating procedure of the memory device. The control electrode CE2 may comprise the second electrode layer 422 as shown in FIG. 1, which may be functioned as a string select line. The control electrode CE1 and the control electrode CE2 may be controlled individually.

The third switch CT3 may be a transistor switch, which may be defined through the electrode film 104 of the first level (or a bottom level) and the memory material film 312 and the channel film 314 of the pillar structure 310 as shown in FIG. 1. The electrode film 104 of the first level and the memory material film 312 are respectively functioned as a control gate electrode (or control electrode CE3) and a gate dielectric of a transistor.

In embodiments, an operating method for the memory device comprises an operating procedure of reading, programming or erasing and so on.

The reading procedure comprises turning on the control electrode CE1 corresponding to the first switches CT1 and the word line switches WT, and turning on the control electrode CE2 corresponding to the second switches CT2. In addition, the reading procedure comprises turning on a selected word line WL (or selected word lines WL) of the word lines WL, and $V_{pass}$ voltage for un-selected word line WL (or un-selected word lines WL) of the word lines WL.

The programming procedure comprises turning on the control electrode CE1 corresponding to the first switches CT1 and the word line switches WT, and turning on the control electrode CE2 corresponding to the second switches CT2. In addition, the programming procedure comprises turning on a selected word line WL (or selected word lines WL) of the word lines WL, and $V_{pass}$ voltage for an un-selected word line WL (or un-selected word lines WL) of the word lines WL.

The erasing procedure comprises turning on the control electrode CE1 corresponding to the first switches CT1 and the word line switches WT to turn on a selected word line WL (or selected word lines WL). In addition, the erasing procedure comprises turning on the control electrode CE3 (the electrode film 104 of the first level) corresponding to the third switches CT3. Moreover, the erasing procedure comprises turning off the control electrode CE2 corresponding to the second switches CT2 to block a signal from the bit line BL, In embodiments, it is permitted for erase single string or block erase. For single string erase, only one the control electrode CE1 is on. For block erase, all the related control electrodes CE1 are on. In embodiments, the word lines WL can be controlled to be turned on or turned off through the word line switches WT. Therefore, it is possible that only the selected transistors are charged, and the remained un-select transistors are not charged. Through which, a whole word line capacitance can be reduced.

In the present disclosure, the memory device and the operating method for the memory device are not limited to the above embodiments, and can be varied.

For example, the first switch CT1, the second switch CT2 and the word line switch WT may individually have amounts of one or more, such as two, three, etc., or other amounts.

Figure 3:
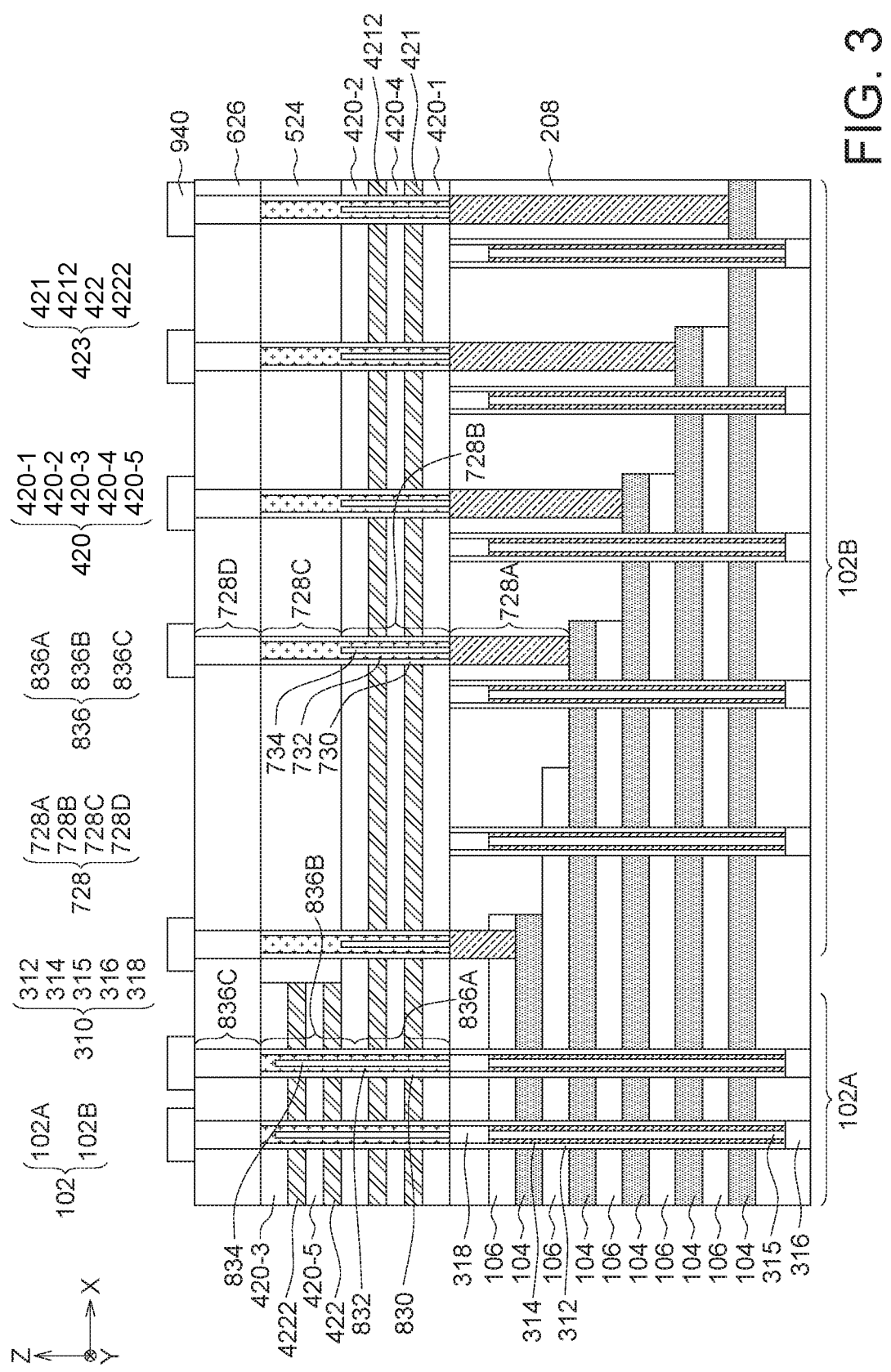
FIG. 3 illustrates a cross-section view of a memory device in another embodiment.

FIG. 3 is referred to, which illustrates a cross-section view of a memory device in another embodiment. The memory device in FIG. 3 is different from the memory device in FIG. 1 with the following description. The insulating layers 420 further comprise an insulating layer 420-4 and an insulating layer 420-5. The electrode layers 423 further comprise a first electrode layer 4212 and a second electrode layer 4222, The insulating layer 420-4 may be on the first electrode layer 421. The first electrode layer 4212 may be on the insulating layer 420-4, The insulating layer 420-2 may be on the first electrode layer 4212. The insulating layer 420-5 may be on the second electrode layer 422. The second electrode layer 4222 may be on the insulating layer 420-5. The insulating layer 420-3 may be on the second electrode layer 4222. The second pillar portion 728B of the pillar element 728 may further pass through the insulating layer 420-4 and the first electrode layer 4212. The first pillar portion 836A of the pillar component 836 may further pass through the insulating layer 420-4 and the first electrode layer 4212. The second pillar portion 836B of the pillar component 836 may further pass through the insulating layer 420-5 and the second electrode layer 4222. The insulating element 524 is also on a sidewall surface of the insulating layer 420-5 and a sidewall surface of the second electrode layer 4222.

Figure 4:
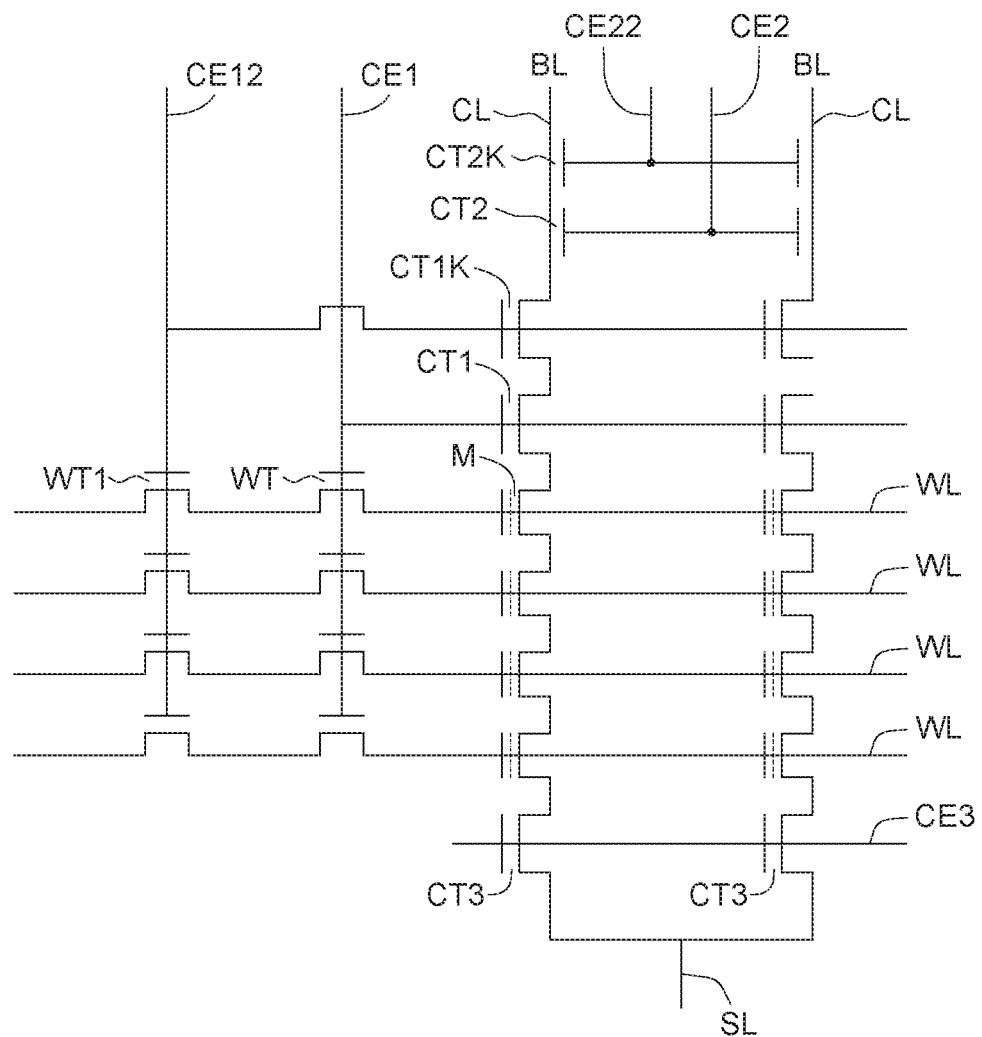
FIG. 4 illustrates a circuit diagram of the memory device in FIG. 3.

FIG. 4 is referred to, which illustrates a circuit diagram of the memory device in FIG. 3. The memory device in FIG. 4 is different from the memory device in FIG. 2 with the following description. The memory device further comprises a first switch CT1K electrically connected in series between the first switch CT1 and the second switch CT2. The memory device further comprises a second switch CT2K. The second switch CT2 is electrically connected in series between the first switch CT1K and the second switch CT2K. The second switch CT2K may comprise the second electrode layer 4222 as shown in FIG. 3. The memory device further comprises a word line switch WT1 electrically connected between the word line switch WT and the word line decoder (not shown). The first switches CT1K and the word line switches WT1 comprise a common control electrode CE12. The control electrode CE12 may comprise the first the electrode layer 4212 as shown in FIG. 3. The first switches CT1K corresponding to different NAND memory strings comprise a common control electrode CE22, The control electrodes CE22 may comprise the second electrode layer 4222 as shown in FIG. 3.

The reading procedure comprises turning on the control electrode CE1 corresponding to the first switches CT1 and the word line switches WT, turning on the control electrode CE12 corresponding to the first switches CT1K and the word line switches WT1 turning on the control electrode CE2 corresponding to the second switches CT2, and turning on the control electrode CE22 corresponding to the second switches CT2K. In addition, the reading procedure comprises turning on a selected word line WL (or selected word lines WL) of the word lines WL, and $V_{pass}$ voltage for an un-selected word line WL (or un-selected word lines WL) of the word lines WL.

The programming procedure comprises turning on the control electrode CE1 corresponding to the first switches CT1 and the word line switches WT, turning on the control electrode CE12 corresponding to the first switches CT1K and the word line switches WT1, turning on the control electrode CE2 corresponding to the second switches CT2, and turning on the control electrode CE22 corresponding to the second switches CT2K. In addition, the programming procedure comprises turning on a selected word line WL (or selected word lines WL) of the word lines WL, and $V_{pass}$ voltage for an un-selected word line WL (or un-selected word lines WL) of the word lines WL.

The erasing procedure comprises turning on the control electrode CE1 corresponding to the first switches CT1 and the word line switches WT and turning on the control electrode CE12 corresponding to the first switches CT1K and the word line switches WT1 to turn on a selected word line WL (or selected word lines WL), In addition, the erasing procedure comprises turning on the control electrode CE3 (the electrode film 104 of the first level) corresponding to the third switches CT3. Moreover, the erasing procedure comprises turning off the control electrode CE2 and the control electrode CE22 respectively corresponding to the second switches CT2 and the second switches CT2K to block signals from the bit lines BL, In embodiments, a circuit using a plurality of the switches (for example two the first switches and two the second switches used in this embodiment) can avoid negative effect resulted from a high bias of the bit line BL (floating bit line bias) in the erasing procedure to the circuit.

In an embodiment, the control electrode CE1 and the control electrode CE12 may be a common electrode, and therefore a simultaneous turning off operating or a simultaneous turning on operating may be performed by applying a common voltage to the control electrode CE1 and the control electrode CE12 in the operating procedure for the memory device. The control electrode CE2 and the control electrode CE22 may be a common electrode, and therefore a simultaneous turning off operating or a simultaneous turning on operating may be performed by applying a common voltage to the control electrode CE2 and the control electrode CE22 in the operating procedure for the memory device. However, the present disclosure is not limited thereto. The control electrode CE1, the control electrode CE12, the control electrode CE2 and the control electrode CE22 may be individually operated.

In an embodiment, the third switches CT3 corresponding to different NAND memory strings may be individually controlled.

FIG. 5 to FIG. 16 illustrate a manufacturing method of the memory device in an embodiment.

Figure 5:
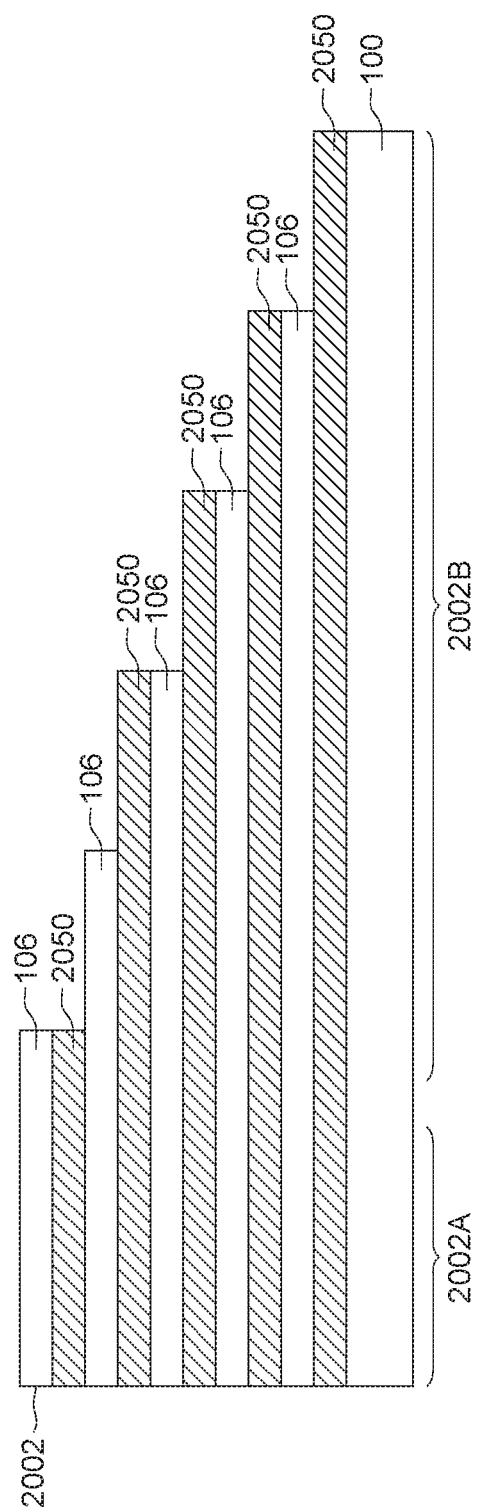
FIG. 5 to FIG. 16 illustrate a manufacturing method of the memory device in an embodiment.

FIG. 5 is referred to. The insulating films 106 (first insulating films) and insulating films 2050 (second insulating films) may be stacked alternately on a substrate (not shown). The substrate may comprise a silicon substrate or other suitable semiconductor material, for example. The insulating film 106 and the insulating film 2050 may use different insulating materials. In an embodiment, the insulating film 106 comprises an oxide such as silicon oxide. The insulating film 2050 comprises a nitride such as silicon nitride. However, the present disclosure is not limited thereto. The insulating films 106 and the insulating films 2050 may be patterned by a photolithography etching process to form a stacked structure 2002 comprising a memory array stack 2002A and a staircase stack 2002B.

Figure 6:
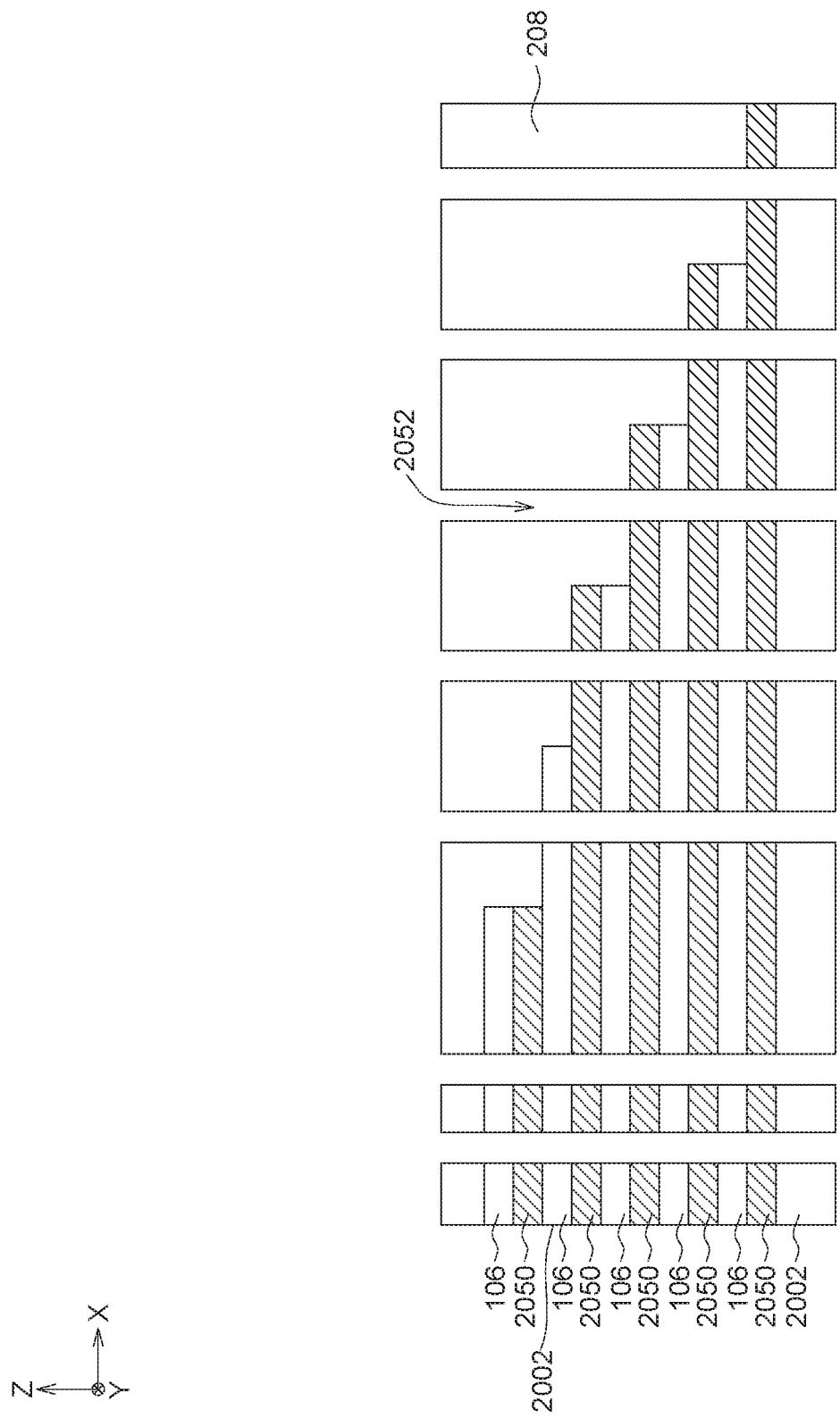
Figure 7:
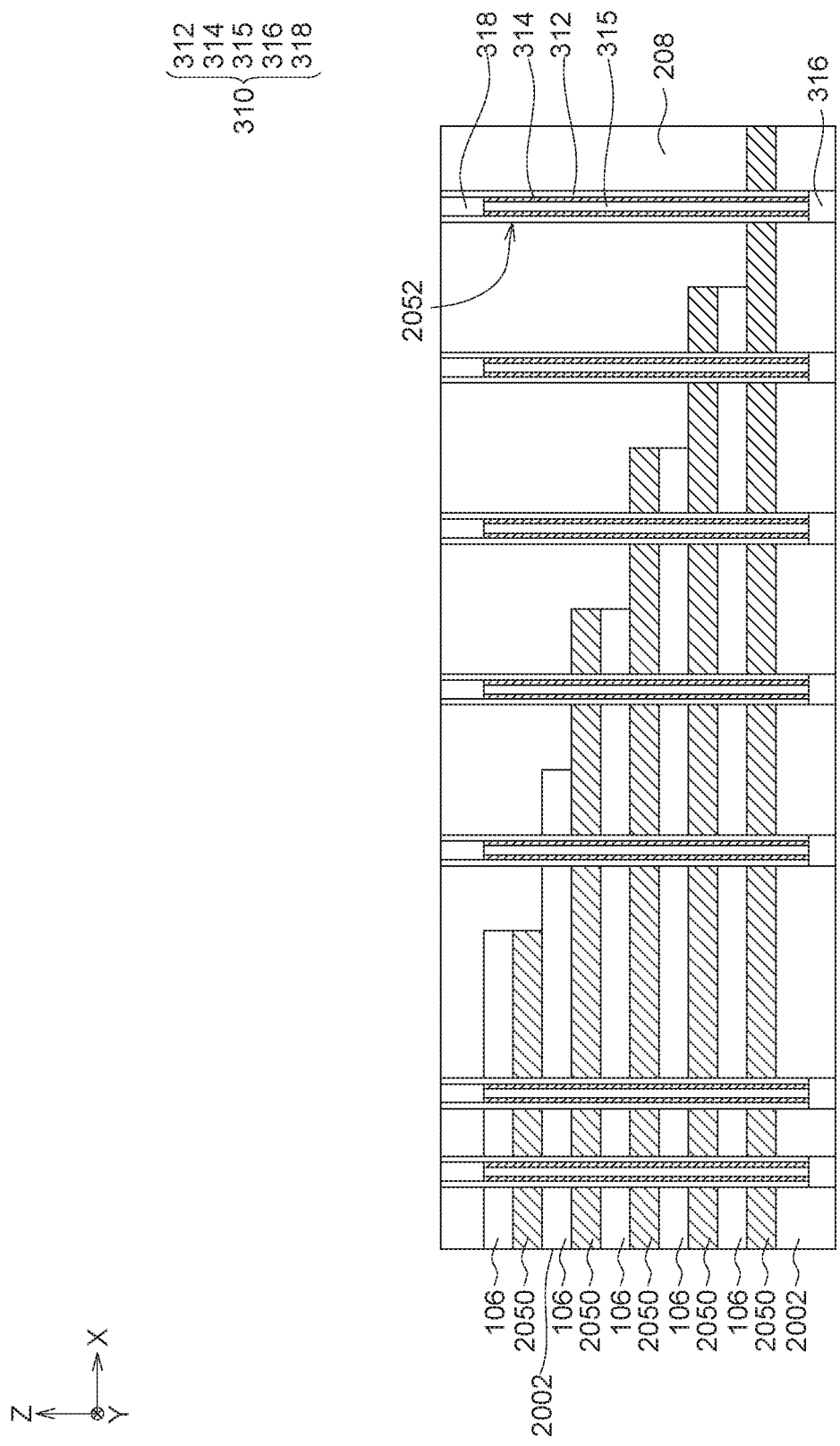

FIG. 6 is referred to. The insulating material film 208 may be formed on the stacked structure 2002. In an embodiment, the insulating material film 208 comprises an oxide such as silicon oxide. However, the present disclosure is not limited thereto. The insulating material film 208 may use other suitable insulating materials. The insulating material film 208 may be flattened by a chemical mechanical polishing or other methods. A photolithography etching process may be performed to form holes 2052 in the stacked structure 2002.

FIG. 1 is referred to. An epitaxial process may be performed to form the epitaxial element 316 on the substrate (not shown) exposed by the hole 2052. The memory material film 312 may be formed on an upper surface of the epitaxial element 316 and a sidewall surface of the tacked structure 2002 exposed by the hole 2052. In an embodiment, the memory material film 312 may comprise any kind of charge trapping structure, such as an ONO structure, an ONONO structure, an ONONONO structure, or BE-SONGS structure, etc. For example, a charge trapping layer may use a nitride such as silicon nitride, or other high-K materials comprising a metal oxide such as $Al_2O_3$, $HfO_2$, etc. The channel film 314 may be formed on the sidewall surface of the memory material film 312. The channel film 314 may have a tube shape, and the insulating pillar 315 may be formed to fill a hollow of the channel film 314. An epitaxial process may be performed to form the epitaxial element 318 on an upper surface of the channel film 314. Therefore, the pillar structure 310 is formed. In an embodiment, the epitaxial element 316 and the epitaxial element 318 may comprise doped polysilicon, such as N type heavily doped polysilicon.

Figure 8:
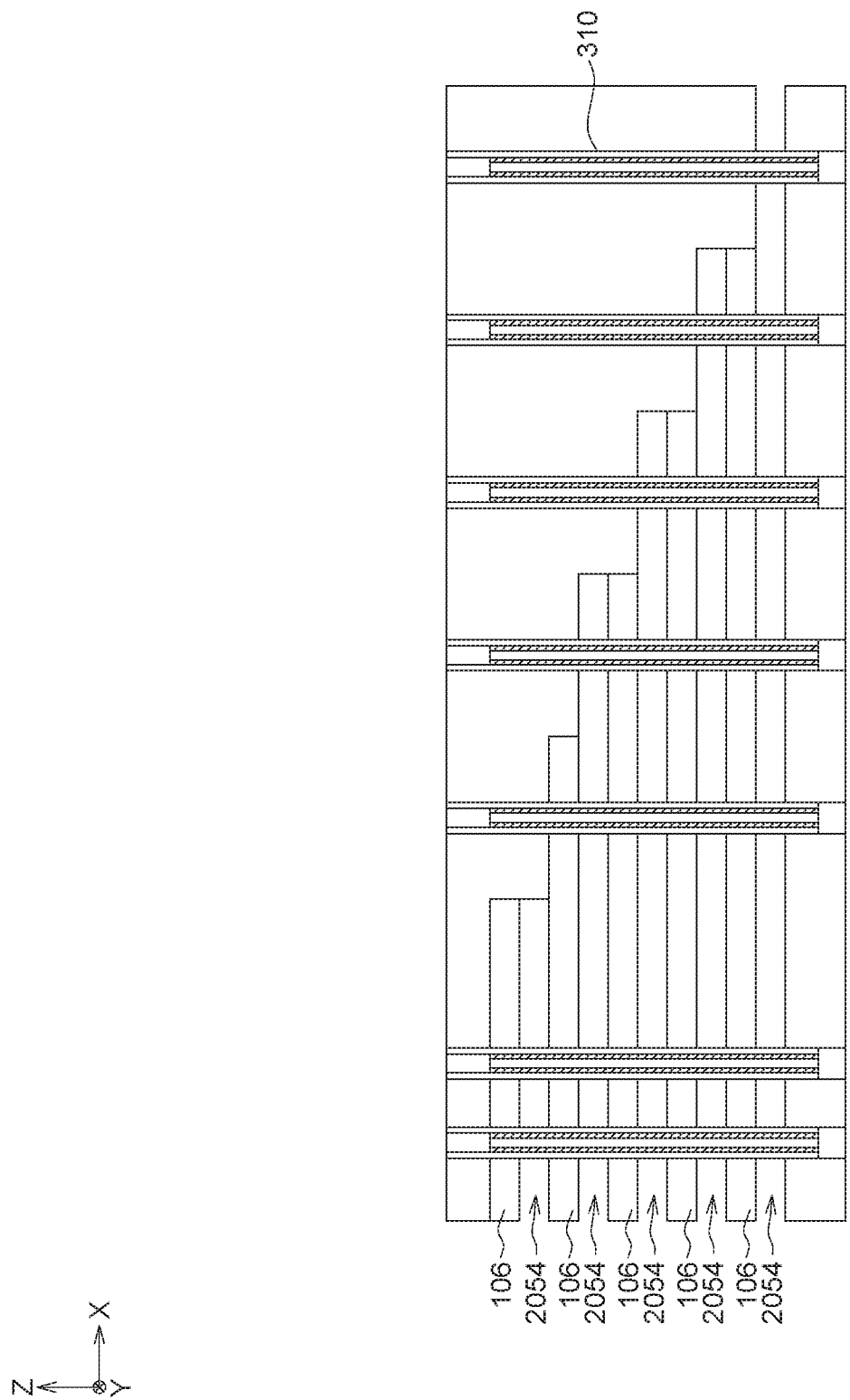

FIG. 8 is referred to. The insulating films 2050 may be removed to form recesses 2054. The pillar structures 310 may support the semiconductor structure to prevent the semiconductor structure from collapsing. In an embodiment, a photolithography etching process may be used to form a slit (not shown) extending in a direction X and a direction Y, and passing through the stacked structure 2002. Side all surfaces of the insulating films 106 and the insulating films 2050 are exposed by the slit (not shown). Next, a selective etching process (such as a wet etching method and so on) may be used to remove the insulating films 2050, while the insulating films 106 are remained.

Figure 9:
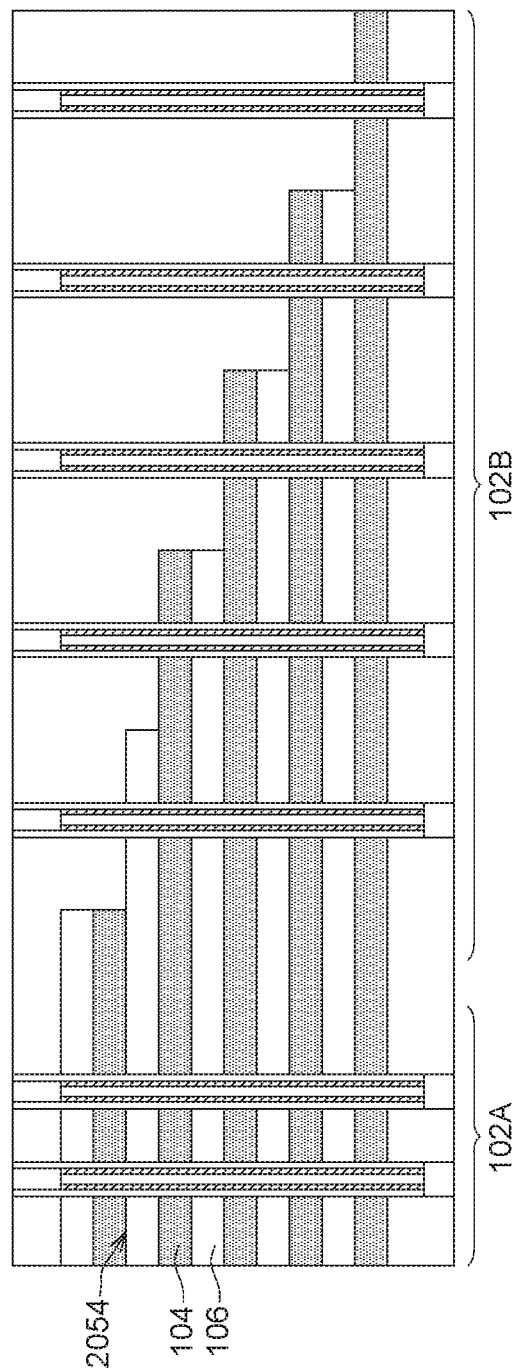

FIG. 9 is referred to. The electrode films 104 may be formed to fill the recess 2054. Therefore, the stacked structure 102 comprising the memory array stack 102A and the staircase stack 102B is formed. The electrode film 104 may comprise a barrier film and a metal film formed on the barrier film. The barrier film may comprise TiN. The metal film may comprise W. However, the present disclosure is not limited thereto.

Figure 10:
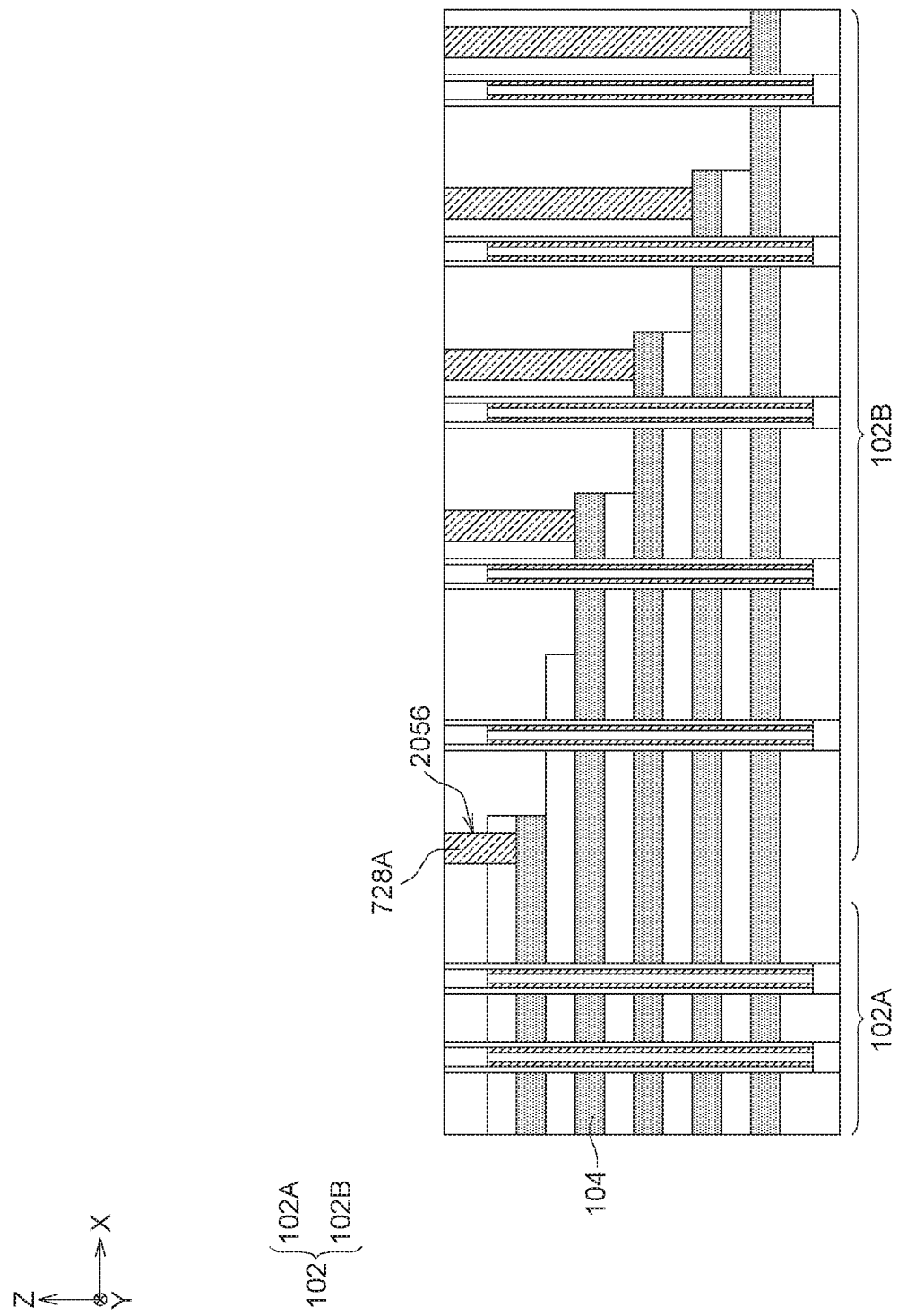
Figure 11:
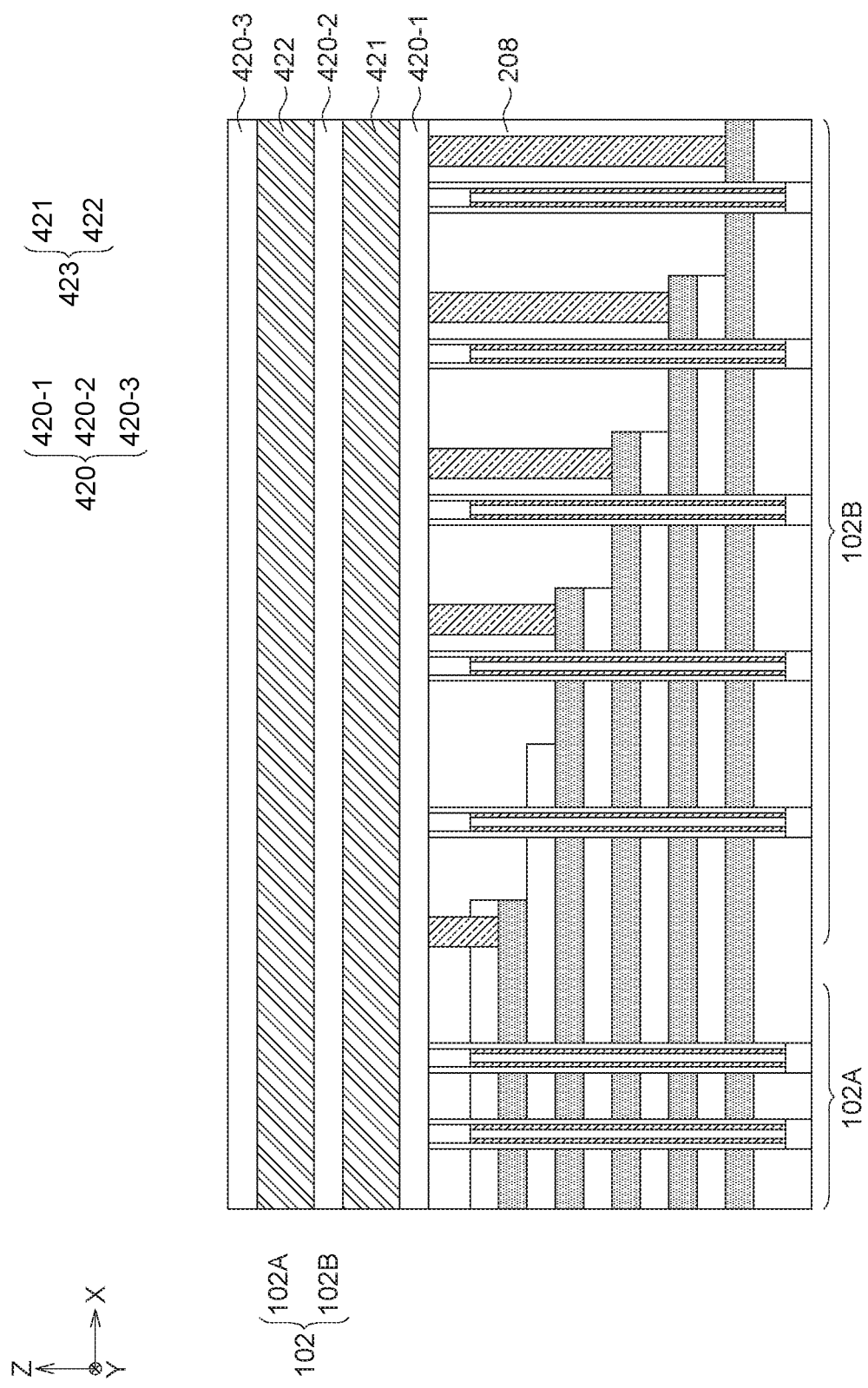

FIG. 10 is referred to. A photolithography etching process may be used to form openings 2056 exposing upper surfaces of the electrode films 104. The opening 2056 may be filled with a conductive material to form the first pillar portion 728A. In an embodiment, the first pillar portion 728A may comprise a barrier film and a metal film formed on the barrier. The barrier film may comprise TiN, The metal film may comprise W. However, the present disclosure is not limited thereto. The conductive material may be flattened by a chemical mechanical polishing method or other methods, FIG. 11 is referred to. Deposition processes may be used to form the insulating layers 420 and the electrode layers 423 stacked alternately on the insulating material film 208. The insulating layers 420 may comprise the insulating layer 420-1, the insulating layer 420-2 and the insulating layer 420-3. The electrode layers 423 comprise the first electrode layer 421 and the second electrode layer 422. The insulating layer 420-1 may be formed on the insulating material film 208, The first electrode layer 421 may be formed on the insulating layer 420-1. The insulating layer 420-2 may be formed on the first electrode layer 421. The second electrode layer 422 may be formed on the insulating layer 420-2. The insulating layer 420-3 may be formed on the second electrode layer 422. The insulating layer 420 may comprise an oxide such as silicon oxide, or other suitable insulating materials. The electrode layers 423 may comprise a metal, or other suitable conductive materials.

Figure 12:
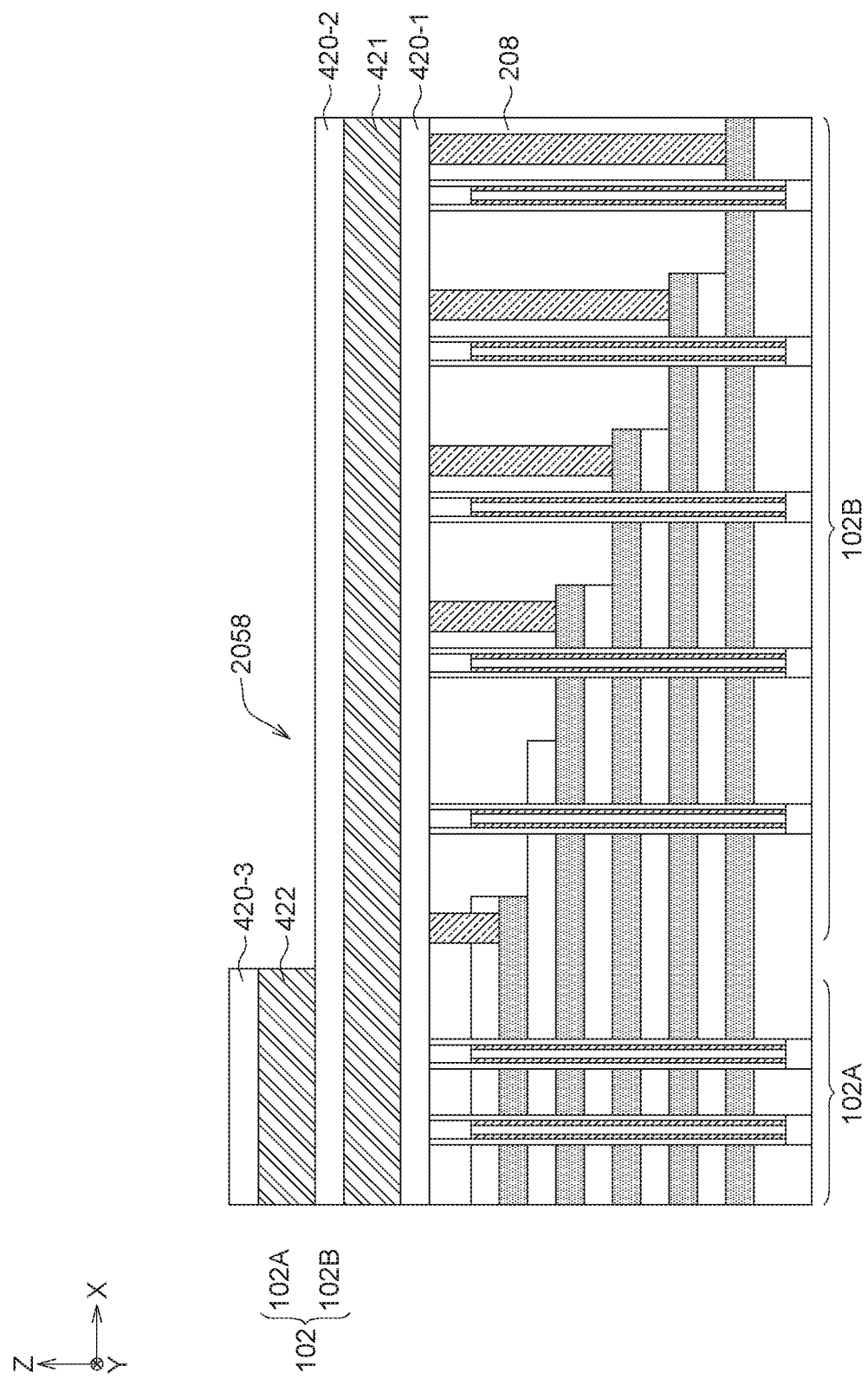

FIG. 12 is referred to. A photolithography etching process may be used to remove portions of the second electrode layer 422 and the insulating layer 420-3 on the second electrode layer 422 corresponding to the staircase stack 102B to form a trench 2058.

Figure 13:
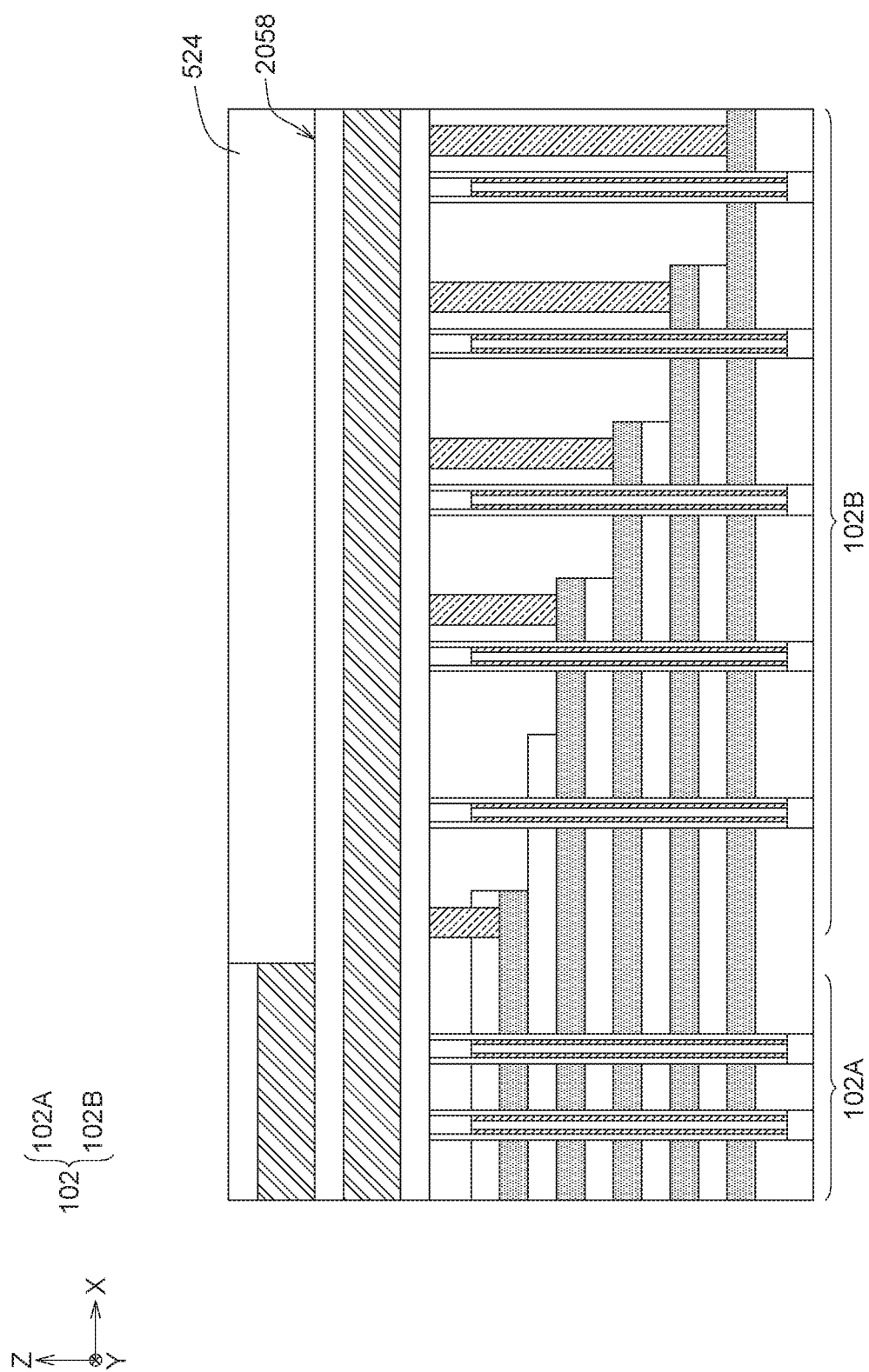

FIG. 13 is referred to. An insulating material may be deposited in the trench 2058 to form the insulating element 524, The insulating element 524 may comprise an oxide such as silicon oxide. However, the present disclosure is not limited thereto. The insulating material may be flattened by a chemical mechanical polishing method or other methods.

Figure 14:
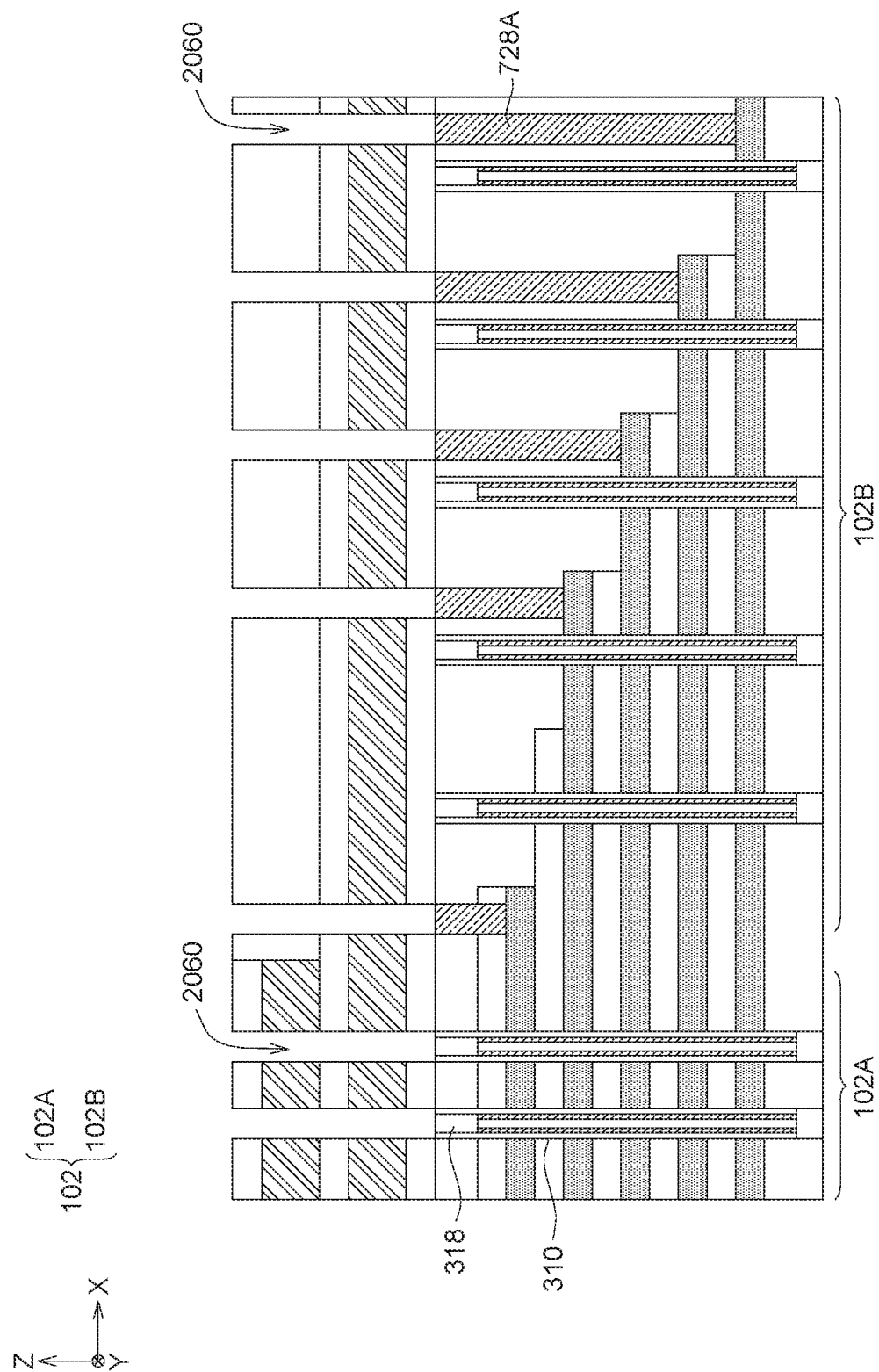

FIG. 14 is referred to. Through holes 2060 may be formed by a photolithography etching process. The through hole 2060 may expose the epitaxial element 318 of the pillar structure 310 in the memory array stack 102A. Otherwise, the through hole 2060 may expose the first pillar portion 728A on the staircase stack 102B. In an embodiment, the epitaxial element 318 and the metal film (such as W or other metals) of the first pillar portion 728A are functioned as etching stop layers for the etching process.

Figure 15:
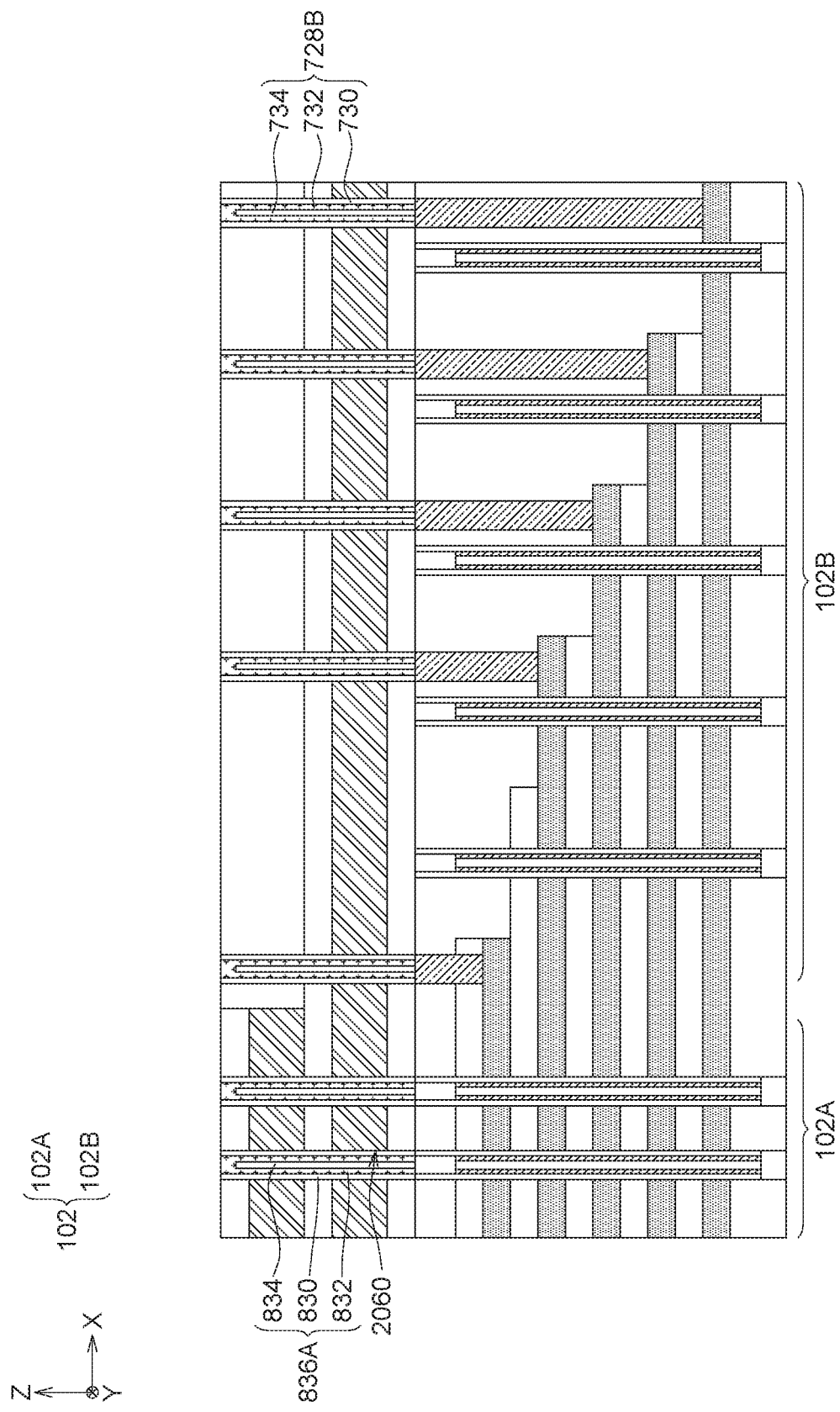

FIG. 15 is referred to. A gate dielectric may be deposited in the through holes 2060, and a bottom portion of the gate dielectric may be removed by anisotropic etching process to form the dielectric element 730 and the dielectric element 830 having a tube shape. The gate dielectric may comprise an oxide such as silicon oxide, or other suitable dielectric materials. The channel element 732 and the channel element 832 may be deposited on sidewalls of the dielectric element 730 and the dielectric element 830 respectively. The channel element 732 and the channel element 832 may comprise un-doped polysilicon, for example. The dielectric pillar 734 and the dielectric pillar 834 may be deposited to fill the through holes 2060. The dielectric pillar 734 and the dielectric pillar 834 may comprise an oxide such as silicon oxide, or other suitable dielectric materials. A doping process may be performed to top portions of the channel element 732 and the channel element 832, and therefore the top portions of the channel element 732 and the channel element 832 may have a material comprising a doped channel material, such as N type heavily doped polysilicon. Through which, the first pillar portion 836A and the second pillar portion 728B may be formed.

Figure 16:
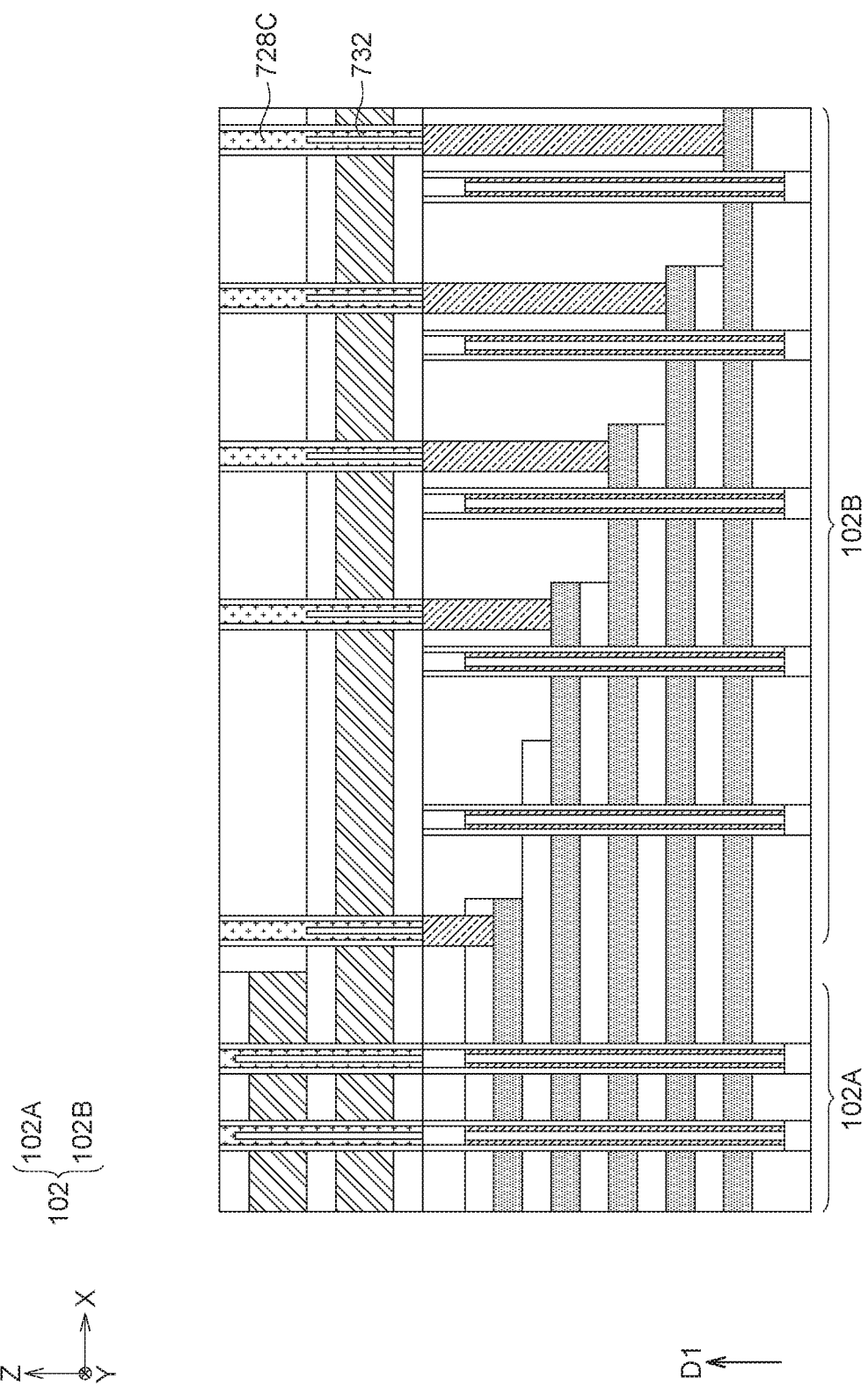

FIG. 16 is referred to. A deep doping process may be performed to top portions of the channel element 732 on the staircase stack 102E to expand a size of the doped channel material (such as N type heavily doped polysilicon) in the vertical direction Z. By which the third pillar portion 728O may be formed.

FIG. 1 is referred to. The dielectric layer 626 may be formed by a deposition method. The metal routing layer 940 may be formed on the dielectric layer 626.

The memory device and the manufacturing method of the memory device are not limited to the above embodiments, and can be varied.

For example, in an embodiment, the substrate may use a bottom source line, such as an N type heavily doped bottom source line, and the memory device as shown in FIG. 1 and FIG. 3 may omit the epitaxial element 316 or a P type doped well. In an embodiment, the process step illustrated with referring to FIG. 16 may be omitted.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    a channel line;
    word lines, wherein memory cells for a memory string are defined at intersections between the channel line and the word lines;
    a first switch electrically connected with the channel line; and
    a second switch electrically connected with the channel line, wherein the first switch is electrically connected between the second switch and the memory cells; and word line switches respectively electrically connected with the word lines, wherein the first switch and the word line switches comprise a common control electrode.

2. The memory device according to claim 1, further comprising a bit line, wherein the second switch is electrically connected between the bit line and the first switch.

3. The memory device according to claim 1, comprising a plurality of the first switches and a plurality of the second switches, wherein the plurality of the first switches is electrically connected between the plurality of the second switches.

4. The memory device according to claim 1, further comprising:
    another channel line, wherein another memory cells for another memory string are defined at intersections between the another channel line and the word lines;
    another first switch electrically connected with the another channel line; and
    another second switch electrically connected with the another channel line, wherein the another first switch is electrically connected between the another second switch and the another memory cells.

5. The memory device according to claim 1, further comprising a third switch electrically connected with the channel line, wherein the memory cells are electrically connected between the first switch and the third switch.

6. The memory device according to claim 5, wherein the first switch and the second switch are functioned as string selection switches, the third switch is functioned as a ground selection switch.

7. The memory device according to claim 1, further comprising insulating films and an insulating layer, wherein each of the word lines comprises an electrode film, the first switch comprises a first electrode layer, the second switch comprises a second electrode layer, the first electrode layer is between the second electrode layer and the electrode films, the electrode films and the insulating films are stacked alternately, the first electrode layer and the second electrode layer are separated from each other by the insulating layer.

8. The memory device according to claim 7, further comprising:
an insulating element on an upper surface of the first electrode layer and a sidewall surface of the second electrode layer; and
a pillar element passing through the insulating element and the first electrode layer.

9. The memory device according to claim 8, wherein the pillar element is electrically connected on one electrode film of the electrode films.

10. The memory device according to claim 1, comprising a first electrode layer, a second electrode layer and a pillar component, wherein the pillar component comprises a channel element and a dielectric element, the pillar component comprises a first pillar portion and a second pillar portion,
the first switch comprises the first electrode layer, and the channel element and the dielectric element of the first pillar portion,
the second switch comprises the second electrode layer, and the channel element and the dielectric element of the second pillar portion.

11. A manufacturing method for the memory device according to claim 1, comprising:
forming a stacked structure, wherein the stacked structure comprises a memory array stack and a staircase stack;
forming a pillar structure, wherein the pillar structure passes through the memory array stack;
forming a first electrode layer, wherein the first electrode layer is on the stacked structure;
forming an insulating layer on the first electrode layer;
forming a second electrode layer on the insulating layer;
forming a pillar element on the staircase stack, and passing through the first electrode layer; and
forming a pillar component on the pillar structure, and passing through the first electrode layer and the second electrode layer.

12. The manufacturing method for the memory device according to claim 11, further comprising forming an insulating element, wherein the insulating element is on an upper surface of the first electrode layer and on a sidewall surface of the second electrode layer, the pillar element passes through the insulating element.

13. The manufacturing method for the memory device according to claim 12, comprising:
forming the second electrode layer on the insulating layer on the memory array stack and the staircase stack;
forming a trench by a method comprising removing a portion of the second electrode layer on the staircase stack; and
forming the insulating element in the trench.

14. The manufacturing method for the memory device according to claim 12, comprising:
forming a through hole in the insulating element, the insulating layer and the first electrode layer; and
forming the pillar element in the through hole.

15. The manufacturing method for the memory device according to claim 11, wherein the forming the stacked structure comprises:
stacking first insulating films and second insulating films alternately, wherein an insulating material of the first insulating films is different from an insulating material of the second insulating films;
removing the second insulating films to form recesses; and
forming electrode films to fill the recesses.

16. The manufacturing method for the memory device according to claim 11, comprising forming a hole in the memory array stack, wherein the forming the pillar structure comprises:
forming a memory material film in the hole; and
forming a channel film on a sidewall surface of the memory material film.

17. The manufacturing method for the memory device according to claim 11, wherein the pillar structure comprises a channel film, the pillar component comprises a channel element electrically connected to the channel film.

18. The manufacturing method for the memory device according to claim 11, comprising forming an epitaxial element, wherein the epitaxial element is electrically connected between the channel element and the channel film.

* * * * *